US012490385B2

United States Patent
Yu et al.

(10) Patent No.: US 12,490,385 B2
(45) Date of Patent: Dec. 2, 2025

(54) KIRIGAMI ENABLED METHOD FOR FABRICATION OF LARGE-FORMAT ELECTRONIC DEVICE ARRAYS

(71) Applicant: The Hong Kong University of Science and Technology, Hong Kong (CN)

(72) Inventors: Hongyu Yu, Hong Kong (CN); Ruoqin Wang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 109 days.

(21) Appl. No.: 17/933,628

(22) Filed: Sep. 20, 2022

(65) Prior Publication Data
US 2023/0118070 A1   Apr. 20, 2023

Related U.S. Application Data

(60) Provisional application No. 63/257,126, filed on Oct. 19, 2021.

(51) Int. Cl.
*H05K 3/00* (2006.01)
*H05K 3/36* (2006.01)
*H05K 3/46* (2006.01)

(52) U.S. Cl.
CPC ......... *H05K 3/0044* (2013.01); *H05K 3/0014* (2013.01); *H05K 3/361* (2013.01); *H05K 3/46* (2013.01)

(58) Field of Classification Search
CPC .... H05K 3/0044; H05K 3/0014; H05K 3/361; H05K 3/46; H05K 1/0283; H05K 1/189; H05K 2201/09263
See application file for complete search history.

(56) References Cited

U.S. PATENT DOCUMENTS 10,715,078 B2 * 7/2020 Jeon ................... F16M 11/38
10,811,777 B1 * 10/2020 Fuchi ................... H01Q 3/01
(Continued)

FOREIGN PATENT DOCUMENTS

CN   114599148 A * 6/2022
EP     4350788 A1 * 4/2024 ............ H10N 10/01
(Continued)

OTHER PUBLICATIONS

Translation of KR-20180115513-A (Year: 2015).*
(Continued)

*Primary Examiner* — Jeffrey T Carley
(74) *Attorney, Agent, or Firm* — SALIWANCHIK, LLOYD & EISENSCHENK

(57) ABSTRACT

A kirigami enabled manufacturing method and systems are provided. The method includes providing a plurality of substrate units for mounting electronic devices in an initial state; providing at least one connector connecting adjacent substrate units of the plurality of substrate units in the initial state, wherein the at least one connector includes one or more foldable areas defined by a plurality of creases and n stretchable layers stacking on one another; folding the one or more foldable areas of the connector along the plurality of creases by 180°; and flipping and expanding the n stretchable layers of the connector into one layer of a planar predetermined pattern connecting the plurality of substrate units. The enabled manufacturing method and systems expand a small area of thin film material to a large area network by the folding and expanding processes.

6 Claims, 9 Drawing Sheets

(56) References Cited

U.S. PATENT DOCUMENTS

| | | | |
|---|---|---|---|
| 11,606,867 B2 * | 3/2023 | Yu | H05K 5/30 |
| 11,901,629 B2 * | 2/2024 | Peterson | H01Q 15/14 |
| 2006/0077644 A1 * | 4/2006 | Nickerson | H01L 24/73 |
| | | | 361/767 |
| 2009/0013526 A1 * | 1/2009 | Yang | H05K 3/0097 |
| | | | 174/250 |
| 2009/0290743 A1 * | 11/2009 | Carroll | H05K 1/189 |
| | | | 381/385 |
| 2015/0346876 A1 * | 12/2015 | Cok | G06F 3/04164 |
| | | | 345/174 |
| 2016/0165719 A1 * | 6/2016 | Li | H05K 1/148 |
| | | | 361/749 |
| 2016/0231784 A1 * | 8/2016 | Yu | G02F 1/133305 |
| 2018/0192520 A1 * | 7/2018 | Choong | H05K 1/189 |
| 2021/0352800 A1 * | 11/2021 | Yu | H05K 3/284 |
| 2022/0369470 A1 * | 11/2022 | Yuen | C08L 1/02 |

FOREIGN PATENT DOCUMENTS

| | | | |
|---|---|---|---|
| JP | 2003195973 A | * | 7/2003 |
| JP | 2016021555 A | * | 2/2016 |
| KR | 20180115513 A | * | 6/2015 |

OTHER PUBLICATIONS

Hua, Q., et al., "Skin-inspired highly stretchable and conformable matrix networks for multifunctional sensing," Nature Communications, 2018, 9(244):1-11.

Lanzara, G., et al., "A Spider-Web-Like Highly Expandable Sensor Network for Multifunctional Materials," Advanced Materials, 2010, 22:4643-4648.

Shafqat, S., et al., "Ultra-Stretchable Interconnects for High-Density Stretchable Electronics," Micromachines, 2017, 8(277):1-13.

* cited by examiner

KIRIGAMI ENABLED METHOD FOR FABRICATION OF LARGE-FORMAT ELECTRONIC DEVICE ARRAYS

CROSS-REFERENCE TO RELATED APPLICATION

This application claims the benefit of U.S. Provisional Application Ser. No. 63/257,126, filed Oct. 19, 2021, which is hereby incorporated by reference in its entirety including any tables, figures, or drawings.

BACKGROUND OF THE INVENTION

Electronic device arrays have a wide range of applications in different industrial fields. For example, in the field of human health monitoring, smart cushions, smart insoles, and smart mattresses, smart products are commonly used for monitoring human body posture, heart rate, sitting, exercising and lying time to provide health advices. Sensor arrays are required to realize these monitoring functions. For instance, in order to accurately detect the sitting posture of a person, about ten pressure sensors need to be installed in the seating area of the smart cushion for monitoring pressure distributions in real-time. For smart mattresses and smart carpets with a larger size, even more sensors are needed to achieve the smart functions. In the field of structural health monitoring, large-scale sensor arrays are used to detect the damage locations of a structure, predict the remaining service time of the structure, or provide advice for maintenance of the mechanical structure to ensure safety. For example, when doing non-destructive testing of surfaces of an aircraft, ultrasonic sensor arrays can help rapidly locate the damage locations and detect degrees of the damage. For large facilities such as airplanes, bridges, or buildings, setting up vibration sensor arrays on critical parts of the structure for long-time monitoring can help collect the load history for estimation of fatigue life to ensure facility safety. Further, large-format electronic device arrays are commonly used in large-scale display equipment such as display screens mounted on the outer walls of buildings.

There are two ways to make an electronic device array at present. The first way is to use the flexible printed circuit (FPC) technology to directly integrate the electronic devices and circuits during the manufacturing process, which is a mature technology and the failure rate is low. However, there are several issues associated with this method. First, the size of the arrays is limited by the maximum allowable area of the production equipment. Second, the area of the substrate material required for production is as large as the area of the array, but the area used by the devices and wires is only a small portion of the whole area and the remaining areas are wasted.

The second way is to connect all the electronic devices with wires after independently installing the electronic devices. This method has great advantages for small array with a few devices. Each device can be independently maintained or replaced, the area of the array and the position of the device can be easily changed by changing the length of the wires, and no special equipment is required for production and installation. However, for large-area dense arrays, this method greatly increases the difficulty of installation and the weight of the system, leading to a high probability of faults by human error.

Moreover, when the number of electronic devices increases, the number of connecting circuit or wires increase correspondingly. Since the electronic devices are discrete components separately manufactured and bonded to form the array network and the connecting circuit network provides physical connections between adjacent nodes on which the electronic components are mounted, the connecting circuits have to cover large areas and the manufacturing such a network poses several challenges. For instance, when wires or cables are employed to connect electronic devices, the wiring patterns can be very complicated, resulting in poorer reliability and increase in cost, weight, and installation efforts. One solution for these issues is manufacturing the connecting circuit network on a flexible sheet for improved integrating capability and higher performance. However, due to capability restrictions of the existing manufacturing technologies, the area covered by this method is limited and most areas of the flexible circuit substrate could not be used.

Thus, there is a lack of methods for fabrication of large-format electronic device arrays in an efficient and low-cost manner.

BRIEF SUMMARY OF THE INVENTION

There continues to be a need in the art for improved designs and techniques for a method and systems for fabricating large-format electronic device arrays.

According to an embodiment of the subject invention, a kirigami enabled manufacturing method is provided. The method comprises providing a plurality of substrate units for mounting electronic devices in an initial state; providing at least one connector connecting adjacent substrate units of the plurality of substrate units in the initial state, wherein the at least one connector comprises one or more foldable areas defined by a plurality of creases and n stretchable layers stacking on one another; folding the one or more foldable areas of the connector along the plurality of creases by 180°; and flipping and expanding the n stretchable layers of the connector into one layer of a planar predetermined pattern connecting the plurality of substrate units, wherein n is an odd integer number greater than or equal to 3. Moreover, when the at least one connector includes a plurality of connectors, further comprising orthogonally expanding adjacent connectors to form a pattern of k*k matrix of substrate units, wherein k is an integer number greater or equal to 2. When lengths of the plurality of connectors in the initial status are same, the pattern of k*k matrix of substrate units formed after expanding has a shape of a rectangle. On the other hand, when lengths of the plurality of connectors in the initial status are not same, the pattern of k*k matrix of substrate units formed after expanding has a three-dimensional (3D) structure. The plurality of substrate units are made of flexible circuit substrates.

In certain embodiment of the subject invention, a manufacturing system is provided, comprising a plurality of substrate holders each coupled to a unit of a foldable substrate pattern; a plurality of slide rails arranged in both a row direction and a column direction; a supporting structure; and a motor, each substrate holder being connected to a first corresponding slide rail in the row direction and a second corresponding slide rail in the column direction, and the slide rails being driven by the motor. Further, the plurality of slide rails are configured to synchronize movements of the unit of the foldable substrate pattern in the row direction or in the column direction to flip and expand the foldable substrate pattern into a planar substrate pattern of a larger format.

In some embodiment of the subject invention, a kirigami enabled manufacturing system is provided, comprising a substrate having a plurality of substrate units for mounting electronic devices, at least one connector connecting adjacent substrate units of the plurality of substrate units, wherein the at least one connector comprises one or more foldable areas defined by a plurality of creases and n stretchable layers stacking on one another; a releasing tape; a base mold; a pushing mold; and a pushing film. Moreover, the releasing tape has top and bottom surfaces with adhesives to attach the substrate onto the base mold. Areas on the releasing tape corresponding to the foldable area of the substrate are hollowed out. The base mold is made by a metal or another rigid material to support the substrate. Areas of the base mold corresponding to the foldable areas of the substrate are hollowed out. Furthermore, the pushing mold is made of a rigid material. The pushing mold is configured to install the pushing film at a position configured to corresponding to the foldable areas of the substrate. The pushing film is made of plastic or another elastic material.

In another embodiment of the subject invention, a kirigami enabled manufacturing method is provided, comprising providing a substrate having a plurality of substrate units for mounting electronic devices, at least one connector connecting adjacent substrate units of the plurality of substrate units, wherein the at least one connector comprises one or more foldable areas and n stretchable layers stacking on one another; attaching a releasing tape to a base mold; transferring the substrate to the base mold; applying adhesive to areas overlapping after folding; pushing up the foldable areas; folding the foldable areas with a rolling device; pressing on the foldable areas and waiting for the adhesive to cure; rotating the base mold and the substrate by 90 degrees and repeatedly performing the folding procedures to the substrate for other folding directions; and releasing the folded substrate from the base mold. In addition, a manufacturing method comprises steps of the above mentioned kirigami enabled manufacturing method and further comprises steps of attaching electronic devices arrays to the substrate and covering the electronic devices arrays and the substrate with a conformal material to protect the electronic devices arrays and circuits of the substrate. The attaching electronic devices arrays to the substrate is performed by welding or bonding. The conformal material is one of a plastic film, silica gel, and fabric.

DETAILED DISCLOSURE OF THE INVENTION

Figure 1:
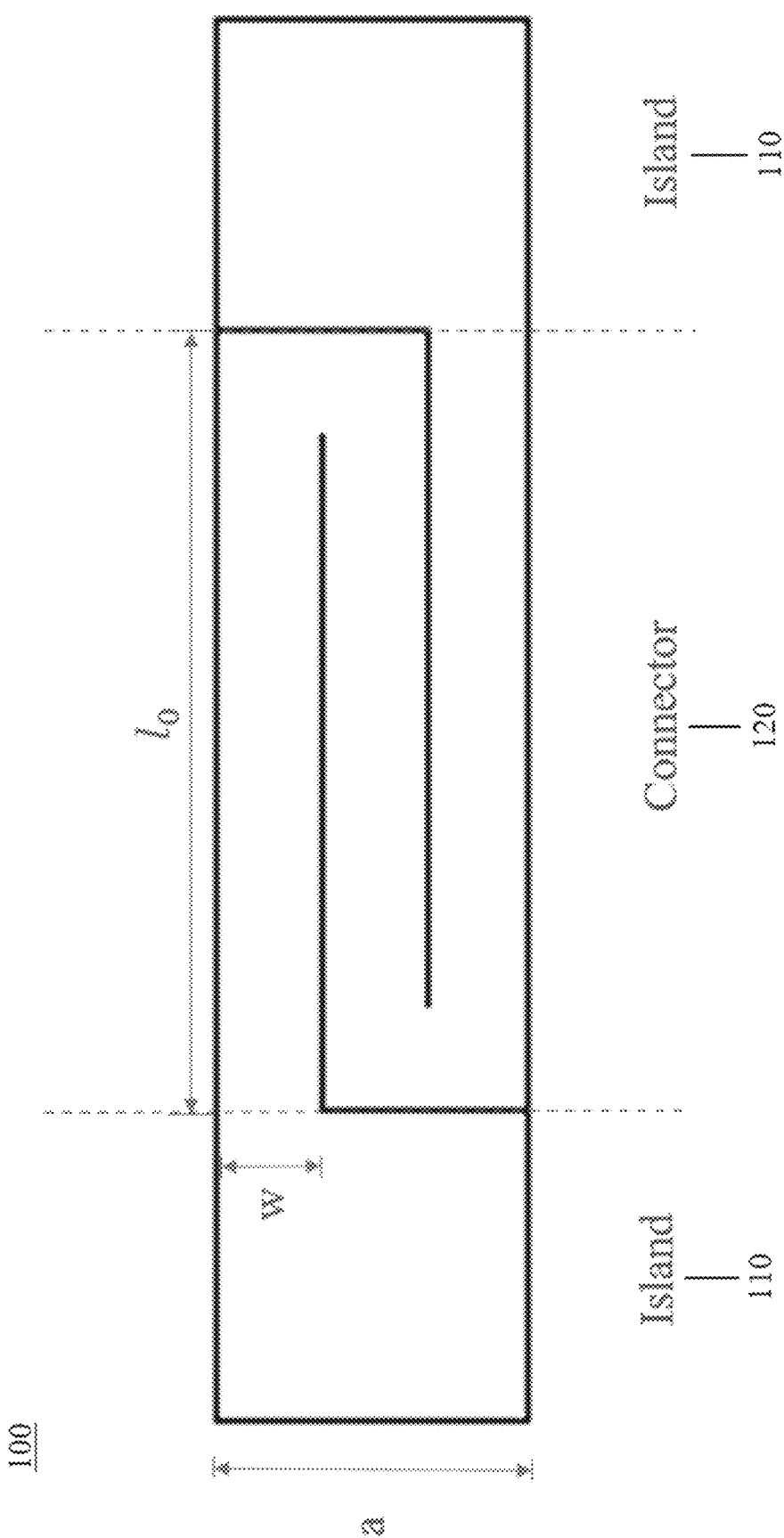
FIG. 1 is a schematic representation of a single connector pattern, according to an embodiment of the subject invention.

The embodiments of subject invention pertain to a kirigami enabled method and systems for fabricating large-format electronic device arrays.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention pertains. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

When the term "about" is used herein, in conjunction with a numerical value, it is understood that the value can be in a range of 90% of the value to 110% of the value, i.e. the value can be +/−10% of the stated value. For example, "about 1 kg" means from 0.90 kg to 1.1 kg.

In describing the invention, it will be understood that a number of techniques and steps are disclosed. Each of these has individual benefits and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the embodiments of the subject invention, dense circuits and devices are first fabricated on a small area of the substrate and then by folding and expanding steps, the small area substrate is expanded into large-area electronic device arrays, realizing flat or curved configurations with various sizes and device densities.

In one embodiment of the subject invention, the kirigami enabled manufacturing method includes following steps: substrate fabricating, device installation (which can also be performed after the step of folding and expanding), folding and expanding, and packaging (which according to specific scenarios of applications can be omitted). Each step will be explained with greater details below.

Substrate fabricating: flexible circuit substrates based on kirigami enabled design patterns can be fabricated by flexible printed circuit (FPC) processing technology or other suitable thin-film fabrication processes.

Device installation: the electronic devices are mounted on the flexible circuit substrates by methods including, but not limited to, welding and bonding.

Folding and expanding: the flexible circuit substrates are folded and expanded with aid of customized molds and tools to obtain large-format electronic device arrays.

Packaging: the flexible circuit substrates are cover with conformal materials such as plastic film, silica gel, or fabric to protect the circuit and devices of the flexible circuit substrates.

Following are examples that illustrate procedures for practicing the invention. These examples should not be construed as limiting.

Kirigami Enabled Fabrication Method

Substrate Fabrication

A flexible circuit substrate having circuits is first fabricated, and electronic devices are then mounted on the flexible circuit substrate. The flexible circuit substrate comprises substrate units ("islands") for mounting the electronic devices and connectors for carrying connecting wires. Adjacent islands are connected by the connector at which both the folding and expanding deformations of the substrate are performed. Each connector comprises one or more foldable areas defined by a plurality of creases and a plurality of stretchable layers stacking on one another. It is noted that the number of layers of the connector has to be an odd number.

Referring to FIG. 1, the simplest substrate pattern unit 100 of the kirigami enabled patterns includes two substrate units ("islands") 110 connected by a connector 120. The substrate pattern unit 100 is defined by three key parameters: $l_0$ is a length of connector in an initial status, w is a width of the connector, and a is a side length of the island.

In certain embodiment, the flexible circuit substrate may be made of a thin-film material such as polyimide (PI), polyethylene terephthalate (PET), Parylene-C, or paper.

In one embodiment, each island has a shape of a square.

In other embodiments, the island has a shape of a rectangle or any other suitable shapes.

Substrate Elongation

Figure 2:
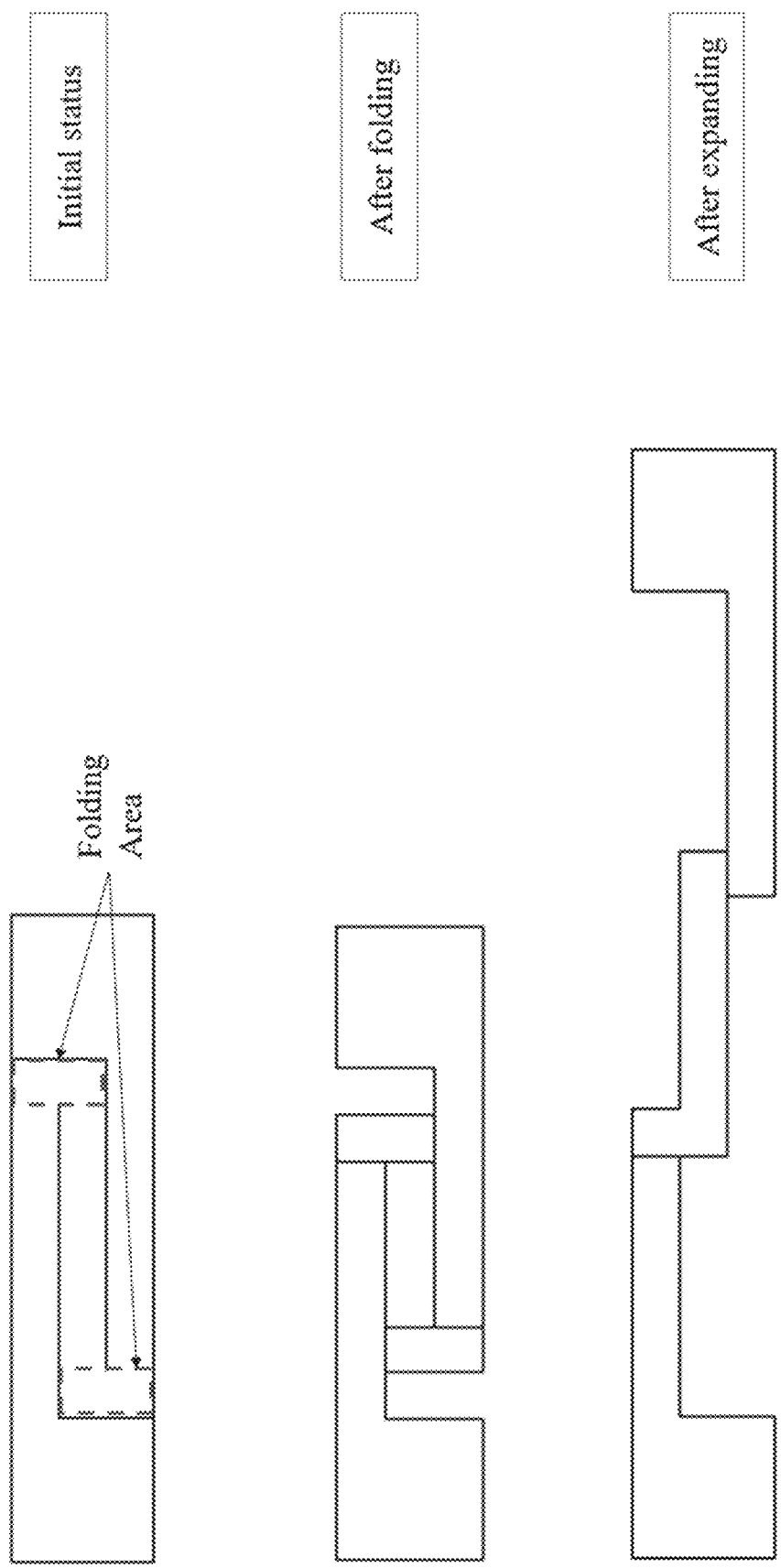
FIG. 2 is a schematic representation of a folding and expanding process of the single connector pattern, according to an embodiment of the subject invention.
Figure 3:
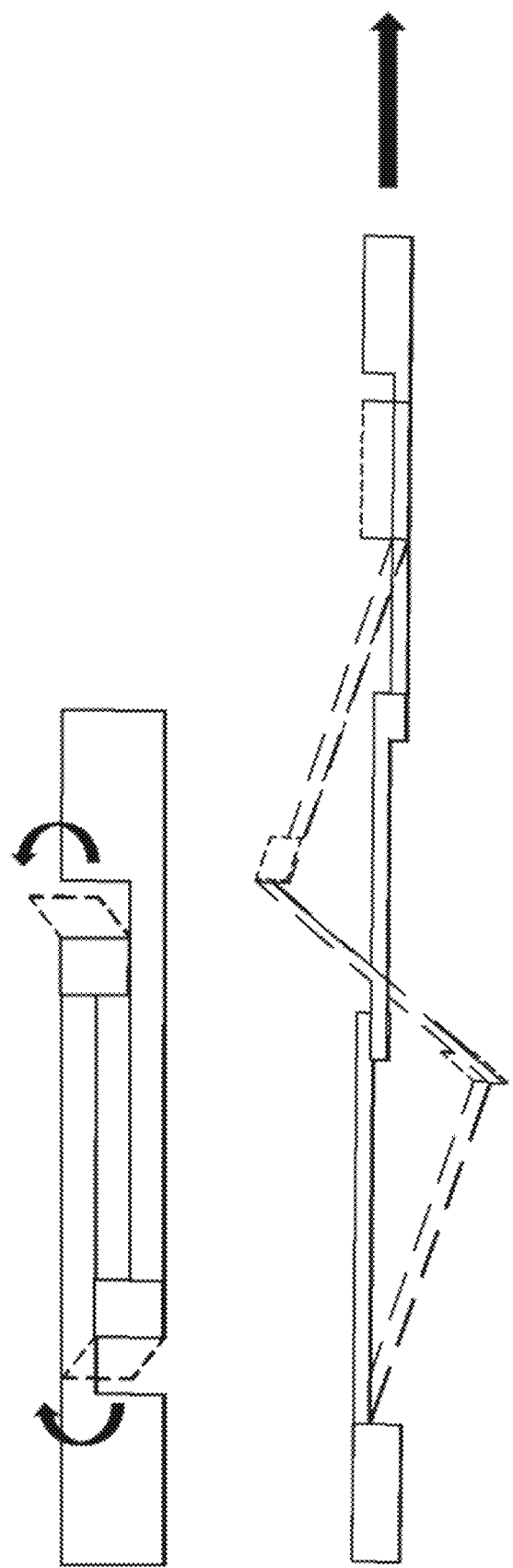
FIG. 3 is a schematic representation of an isometric view of the folding and expanding process, according to an embodiment of the subject invention.

Referring to FIG. 2 and FIG. 3, the elongation process is divided into two steps. The first step is folding the one or more folding areas by 180° and the second step is stretching the plurality of stretchable layers of the flexible circuit substrate into one layer of a flat predetermined pattern connecting the plurality of substrate units.

By varying the length and width of the connector, different the elongation rate can be achieved. For instance, the connector in FIG. 2 has three stretchable layers. For a longer elongation, the connector may have five layers, seven layers or other number of layers. It is noted that the number of layers of the connector has to be an odd number.

2D Expansion of Substrate

Figure 4:
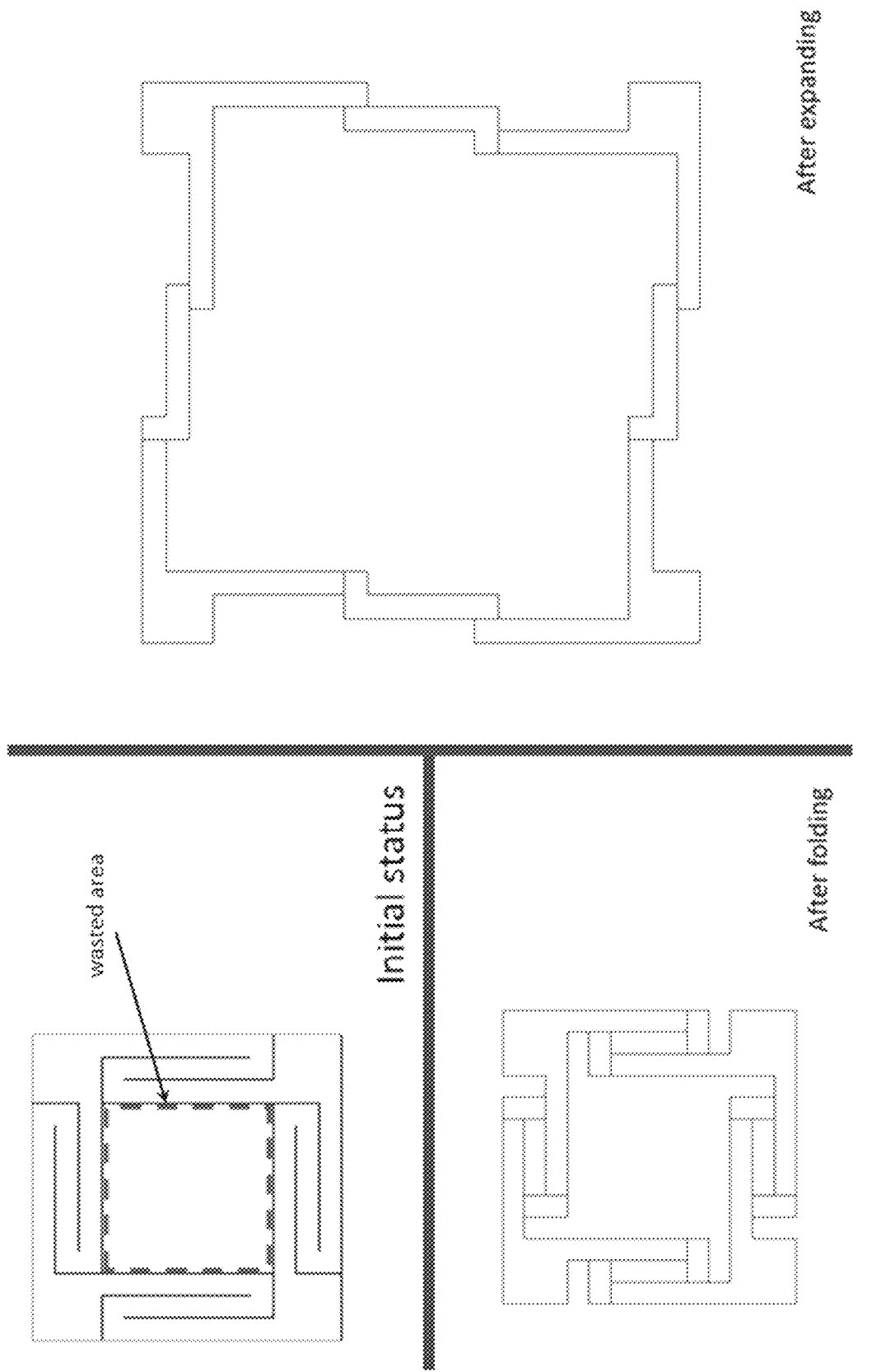
FIG. 4 is a schematic representation of a first embodiment folding and expanding process of a 2*2 electronic device array, according to an embodiment of the subject invention.

In one embodiment of the subject invention, the one-dimensional (1D) elongation process can be easily turned into a two-dimensional (2D) expansion process by expanding the connectors orthogonally. FIG. 4 shows orthogonally expanding the pattern of FIG. 3 into a 2*2 matrix of electronic device arrays.

It is observed that in the 2D expansion process of FIG. 4, there is an area in the middle of the pattern not expandable and thus wasted.

Figure 5:
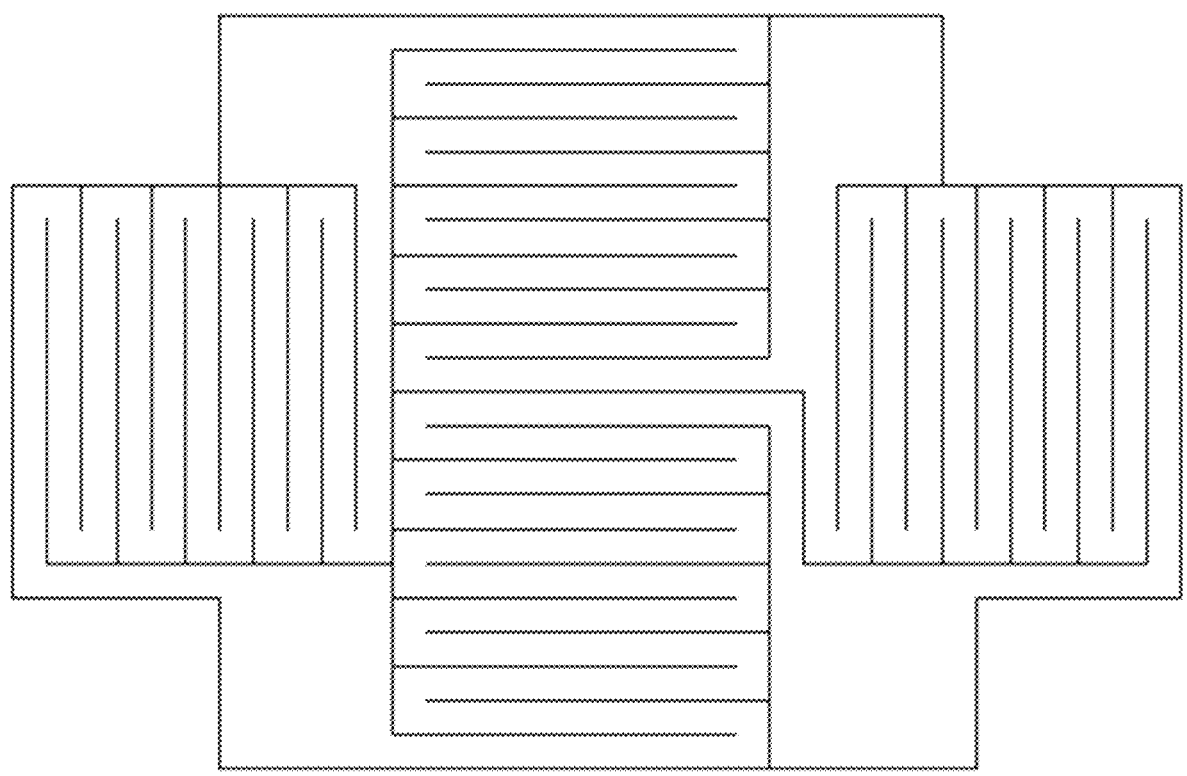
FIG. 5 is a schematic representation of a second embodiment of a 2*2 electronic device array with larger expansion rate and higher area utilization rate, according to an embodiment of the subject invention.

In one embodiment, as shown in FIG. 5, a flexible substrate pattern is provided to reduce the wasted area.

Figure 6:
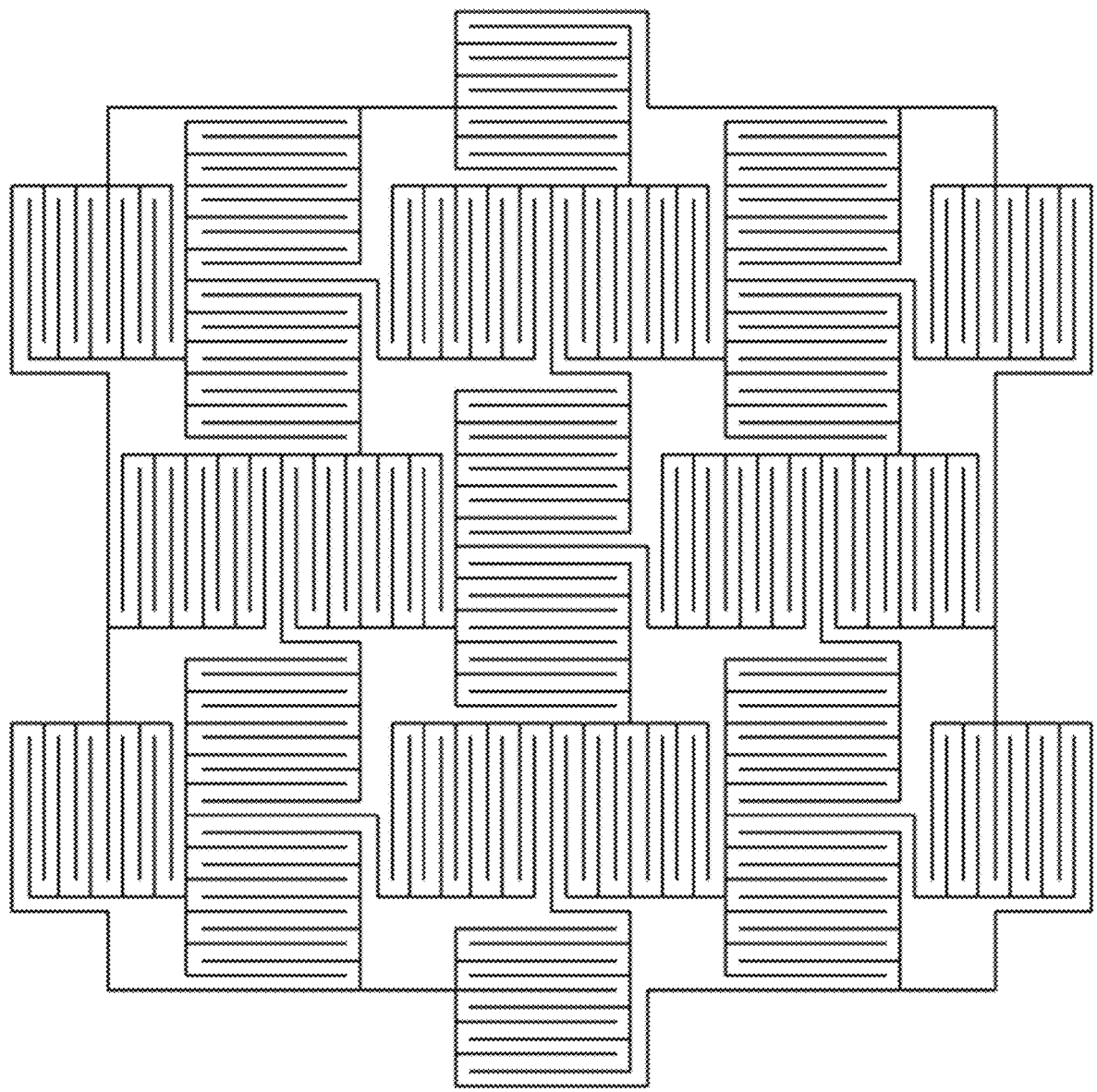
FIG. 6 is a schematic representation of 4*4 array using high efficiency design, according to an embodiment of the subject invention.

In an array with a larger number of islands, the advantage of the design is much greater. On one hand, the wasted area is reduced. On the other hand, the expansion rate of the flexible circuit substrate is increased. FIG. 6 shows 4*4 electronic device arrays based on a highly efficient flexible substrate pattern.

3D Structure of Substrate

As described above, each island is connected to its neighboring islands through connectors and each connector can be independently designed. The length of the connector determines the length of the rows and columns of the electronic device arrays, and the length of the rows and columns determines the shape of the entire electronic device arrays. If all rows have the same length and all columns have the same length, the electronic device arrays are formed to have a shape of a rectangle. On the other hand, if the lengths of the row are not the same or the lengths of the columns are not the same, a three-dimensional (3D) structure of the flexible circuit substrate can be constructed.

Figure 7:
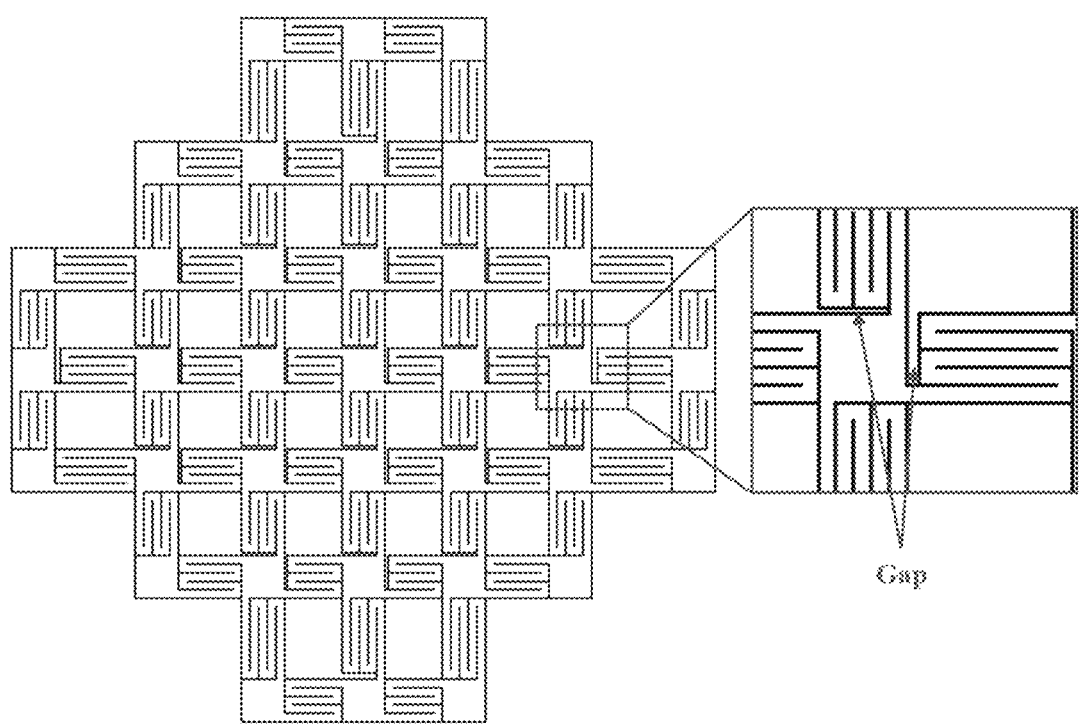
FIG. 7 is a schematic representation of a flexible circuit substrate designed for a 3D hemispherical curved pattern at its initial status, according to an embodiment of the subject invention.

In one embodiment, a flexible circuit substrate designed for a 3D hemispherical curved pattern at its initial status (before being folded and expanded) is illustrated in FIG. 7. The gaps shown in FIG. 7 are configured to control the lengths of the connectors. The lengths of the gaps are configured to allow the connectors to have different lengths after the flexible circuit substrate is expanded. In turn, the lengths of the connectors between the islands control the shape of the expanded 3D hemispherical curved pattern.

Figure 8:
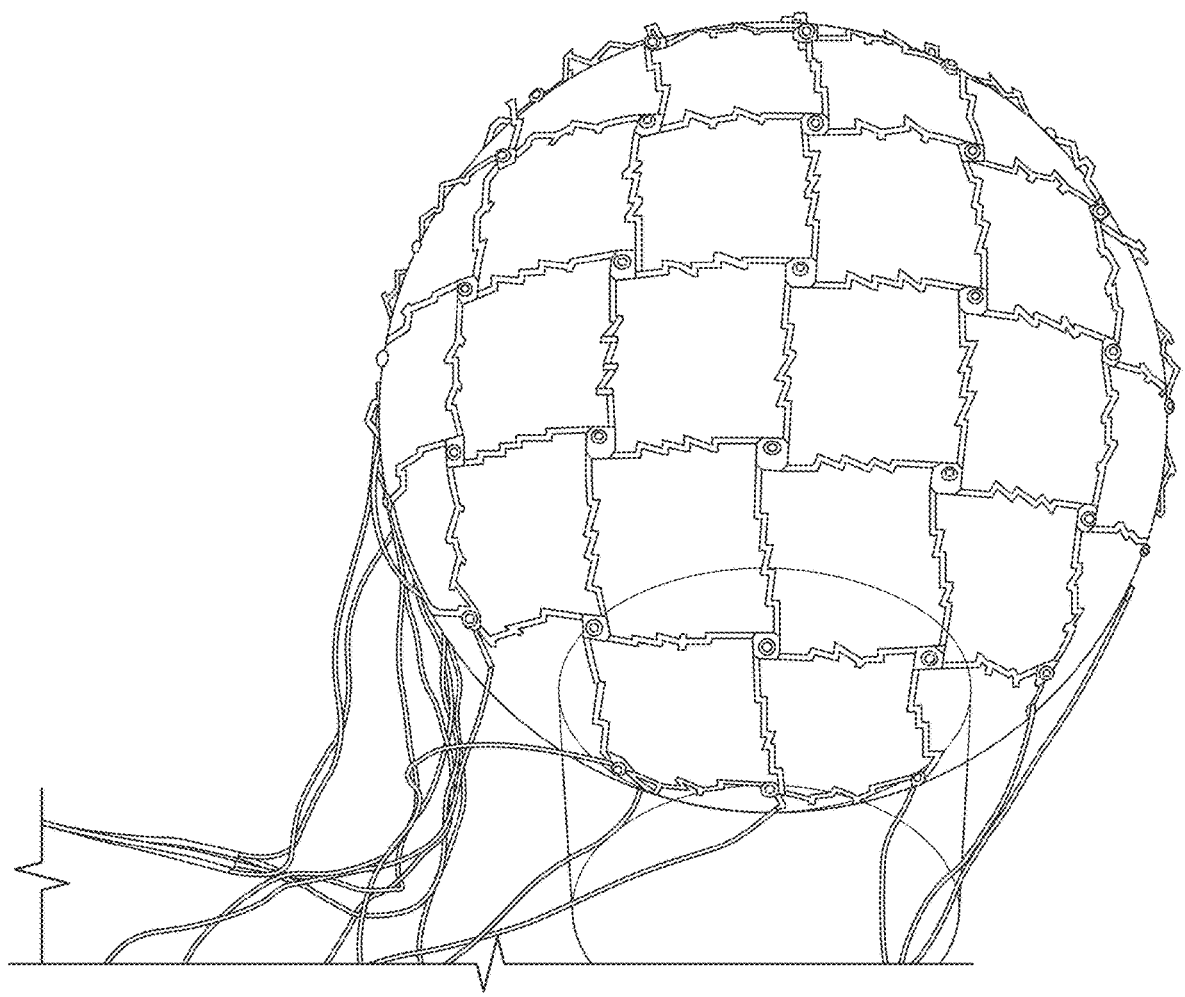
FIG. 8 is a schematic representation of the 3D folded and expanded hemispherical curved pattern, according to an embodiment of the subject invention.

Next, the 2D thin-film flexible circuit substrate of FIG. 7 is converted, by the folding and expanding processes, into the 3D hemispherical curved pattern having a network of curve surfaces as demonstrated in FIG. 8.

Folding Tools

Figure 9:
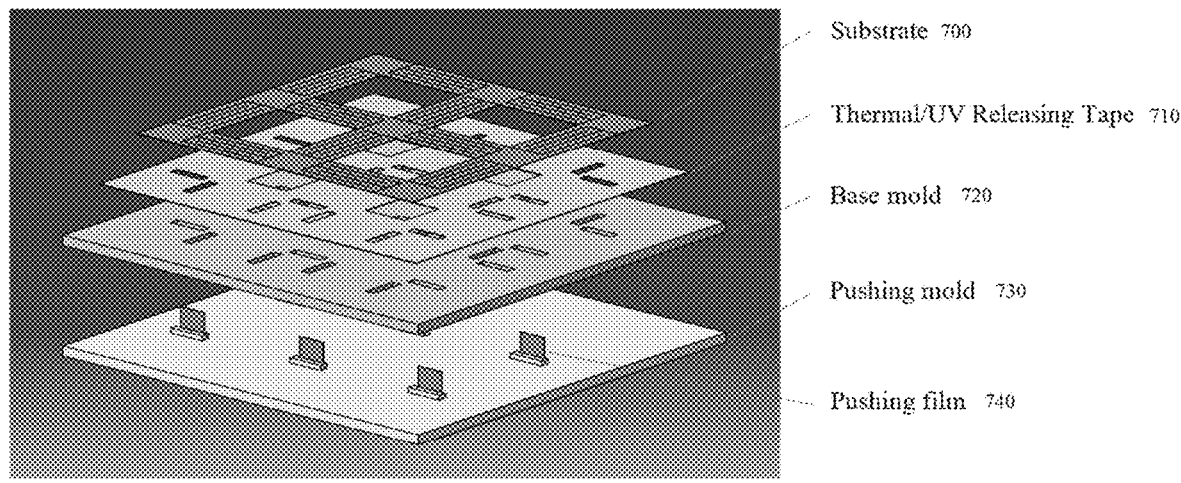
FIG. 9 is a schematic representation of the molds and tools for folding a 3*3 electronic device array, according to an embodiment of the subject invention.

The flexible circuit substrate can be folded through customized molds and tools. As illustrated in FIG. 9, following molds and tools are provided for folding.

The releasing tape 710 having adhesives on both sides of the tape is provided to fix the flexible circuit substrate 700 onto the base mold 720. The areas on the tape that correspond to the folding area of the flexible circuit substrate 700 are hollowed out.

The base mold 720 is made by metal or other rigid materials to support the flexible circuit substrate 700. In the same manner, the areas of the base mold 720 corresponding to the folding area of the flexible circuit substrate 700 are hollowed out.

The pushing mold 730 is made of rigid materials and the pushing film 740 is made of plastic or other elastic materials. The pushing mold 730 is used to install the pushing film 740 and the position of the pushing film 740 is included in the folding area of the flexible circuit substrate 700.

With the aid of the folding tools, following steps of the folding processes are performed:

picking up the freestanding flexible circuit substrate by a blue tape, attaching the releasing tape to the base mold, transferring the flexible circuit substrate from blue tape to the base mold, applying glue to the area that has overlap after the folding, pushing up the folding area, folding the folding area with a roller, pressing on the folded area and waiting for the glue to fully cure, rotating the base mold and the flexible circuit substrate by 90 degrees and repeating the folding procedures three times since there are 4 directions need to be folded, and releasing the flexible circuit substrate from the mold by hot air or UV light.

Expanding Tools

Figure 10:
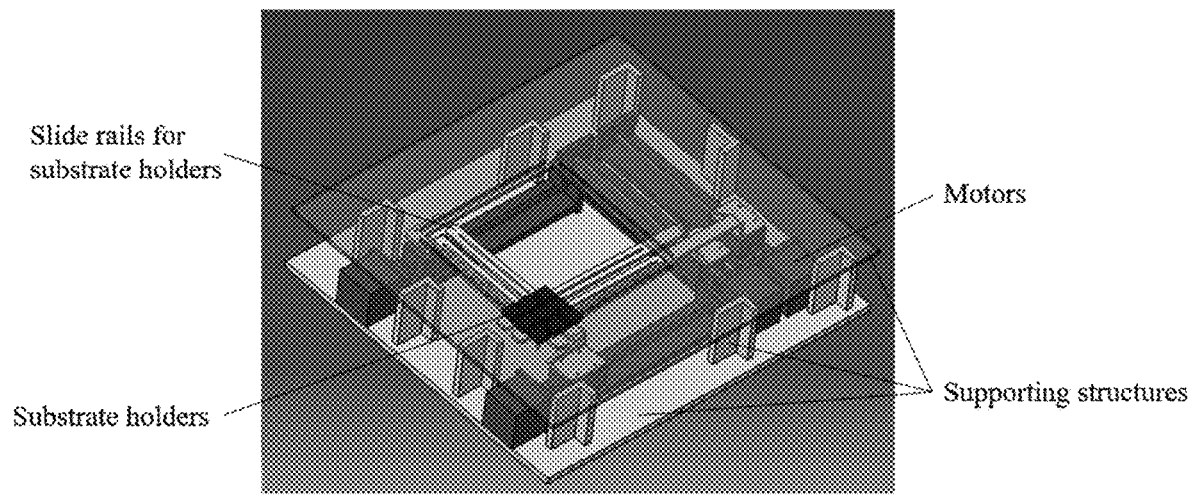
FIG. 10 is a schematic representation of an expanding system for an electronic device 3*3 array, according to an embodiment of the subject invention.

The step of expanding is to synchronize the movements of the islands on each row and each column of the electronic device arrays. This task can be performed by a multiple slide rails system as shown in FIG. 10. Each island of the flexible circuit substrate is connected to a holder, and each holder is connected to a corresponding slide rail in the row and column at the same time, and each slide rail is driven by a motor. Accordingly, the synchronization of the movements of each row and each column can be achieved and the flexible circuit substrate can be uniformly expanded.

Electronic Devices Installation

Electronic devices can be installed on the flexible circuit substrate before or after the processes of folding and expanding, depending on the applications. The electronic devices can be installed on the flexible circuit substrate by welding, bonding, or any other suitable methods. The connecting pad can be directly made on the islands of the flexible circuit substrate.

Packaging

After performing the steps of folding, expanding, and installation of the electronic devices, the electronic device arrays can be covered by conformal materials to protect the circuit and the electronic devices. Since the electronic device arrays have a good flexibility but a poor stretchability, PET, PI or any other suitable plastic films may be used for packaging the electronic device arrays.

In the embodiments of the subject invention, electronic device arrays of a large format are fabricated based on kirigami pattern design to increase the production efficiency and reduce the production cost, thereby achieving low-cost fabrication and enabling fabrication of large format sensing or display arrays having various sensors or luminous elements.

The embodiments of the subject invention offer two advantages. First, the materials needed for making an array of the same area are greatly reduced, thereby improving the material utilization rate and significantly reducing the mass production costs. Second, large-area arrays can be fabricated by expanding a small area of thin film material by a smaller machine, improving production capacities of the fabrication machines of electronic device arrays.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

We claim:

1. A manufacturing method comprising:
providing, in an initial state, a plurality of substrate units for mounting electronic devices;
providing at least one connector connecting adjacent substrate units of the plurality of substrate units in the initial state, wherein the at least one connector comprises one or more foldable areas such that each foldable area has a shape defined by a plurality of creases and n stretchable layers stacking on one another, with n being greater than or equal to 3;
folding the one or more foldable areas of the connector along the plurality of creases by 180°, while the n stretchable layers remain intact; and
flipping and expanding the n stretchable layers of the connector into one layer of a planar predetermined pattern connecting the plurality of substrate units to generate a larger exposed surface area;
wherein each of the one or more foldable areas is connected to other parts of the at least one connector along a folding edge,
wherein each of the one or more foldable areas has a quadrilateral shape defined by the folding edge and three additional edges and has an area smaller than the other parts of the at least one connector,
wherein in an unfolded state two of the three additional edges are edge-contacted with two corresponding edges of the other parts of the at least one connector, respectively, without being fixedly connected to the other parts of the at least one connector, and the remaining additional edge is not in contact with the other parts of the at least one connector, allowing each of the one or more foldable areas to rotate relative to the other parts of the at least one connector along the corresponding folding edge, and
wherein the rotation of the foldable area occurs independently while the other parts of the at least one connector remain stationary.

2. The manufacturing method of claim 1, wherein n is an odd integer number greater than or equal to 3.

3. The manufacturing method of claim 1, when the at least one connector includes a plurality of connectors, further comprising orthogonally expanding adjacent connectors to form a pattern of k*k matrix of substrate units, wherein k is an integer number greater or equal to 2.

4. The manufacturing method of claim 3, wherein when the plurality of substrate units are in the initial state, lengths of the plurality of connectors are same as one another, and the pattern of k*k matrix of substrate units formed after expanding has a shape of a rectangle.

5. The manufacturing method of claim 3, wherein when the plurality of substrate units are in the initial state, lengths of the plurality of connectors are not same as one another, and the pattern of k*k matrix of substrate units formed after expanding has a three-dimensional (3D) structure.

6. The manufacturing method of claim 1, wherein the plurality of substrate units are made of flexible circuit substrates.

* * * * *